(12) United States Patent
Ikegame et al.

(10) Patent No.: US 9,696,620 B2
(45) Date of Patent: Jul. 4, 2017

(54) COMPOSITION, METHOD FOR PRODUCING FILM WITH THE COMPOSITION, AND METHOD FOR PRODUCING LIQUID DISCHARGE HEAD

(71) Applicant: CANON KABUSHIKI KAISHA, Tokyo (JP)

(72) Inventors: Ken Ikegame, Ebina (JP); Miho Ishii, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/692,496

(22) Filed: Apr. 21, 2015

(65) Prior Publication Data

US 2015/0309407 A1    Oct. 29, 2015

(30) Foreign Application Priority Data

Apr. 23, 2014 (JP) ................. 2014-088979

(51) Int. Cl.
| | | |
|---|---|---|
| G03F 7/038 | (2006.01) | |
| G03F 7/38 | (2006.01) | |
| G03F 7/095 | (2006.01) | |
| B41J 2/16 | (2006.01) | |
| G03F 7/004 | (2006.01) | |
| G03F 7/027 | (2006.01) | |
| G03F 7/075 | (2006.01) | |
| C09D 5/16 | (2006.01) | |

(52) U.S. Cl.
CPC ............ *G03F 7/038* (2013.01); *B41J 2/1631* (2013.01); *G03F 7/0046* (2013.01); *G03F 7/027* (2013.01); *G03F 7/0388* (2013.01); *G03F 7/0755* (2013.01); *G03F 7/095* (2013.01); *G03F 7/38* (2013.01); *C09D 5/1637* (2013.01); *C09D 5/1668* (2013.01); *C09D 5/1675* (2013.01)

(58) Field of Classification Search
None
See application file for complete search history.

(56) References Cited

U.S. PATENT DOCUMENTS

| | | | | |
|---|---|---|---|---|
| 7,074,273 B2 * | 7/2006 | Shimomura | ........... | B41J 2/1606 118/302 |
| 2004/0077775 A1 * | 4/2004 | Audenaert | ........... | C08G 65/007 524/567 |
| 2012/0164565 A1 * | 6/2012 | Qiu | ........ | C08F 220/24 430/5 |
| 2014/0044932 A1 * | 2/2014 | Fall | ......... | G03F 7/027 428/195.1 |

FOREIGN PATENT DOCUMENTS

| | | | | | |
|---|---|---|---|---|---|
| CN | 101412779 A | * | 4/2009 | | |
| EP | 0942024 a2 | * | 9/1999 | | |
| JP | 4174124 B2 | | 10/2008 | | |
| JP | 2011-184517 A | | 9/2011 | | |
| WO | WO-2009/114580 A2 | * | 9/2009 | ............... | G03F 1/48 |

OTHER PUBLICATIONS

English abstract and addended material for CN-101412779 A as set forth in Scifinder database as Accession No. 2009:503963, CAN 150:540643, CAPLUS, Source: Faming Zhuanli Shenqing, 7pp., Patent, 2009, downloaded 2015, 3 pages.*
English translation of Patent : CN101412779B obtained Apr. 17, 2016 from Espacenet, 15 pages.*

* cited by examiner

*Primary Examiner* — Cynthia Hamilton
(74) *Attorney, Agent, or Firm* — Canon U.S.A., Inc., IP Division

(57) ABSTRACT

A composition includes a photoacid generator and a fluorine-containing epoxy resin that is a polymer of monomers that include an acrylic monomer (a) having a perfluoropolyether group having 9 or more carbon atoms and an acrylic monomer (b) having an epoxy group in a composition ratio such that a number of acrylic functional groups derived from the acrylic monomer (b) is larger than a number of acrylic functional groups derived from the acrylic monomer (a).

8 Claims, 2 Drawing Sheets

COMPOSITION, METHOD FOR PRODUCING FILM WITH THE COMPOSITION, AND METHOD FOR PRODUCING LIQUID DISCHARGE HEAD

BACKGROUND OF THE INVENTION

Field of the Invention

The present invention relates to a composition, a method for producing a film with the composition, and a method for producing a liquid discharge head.

Description of the Related Art

In recent years, techniques for further enhancing recording characteristics of inkjet recording systems have been developed. An inkjet recording head discharges small droplets through openings of discharge ports to a recording medium represented by a paper sheet to thereby record an image. The performance of inkjet recording heads has been improved by employing smaller droplets, a higher driving frequency, and a larger number of discharge ports. In order to discharge such small droplets with stability and maintain the discharge performance, it is important that the surface having openings of discharge ports is always maintained in the same state. In order to maintain the state of the surface having openings of discharge ports, a surface treatment of forming a water-repellent layer is often carried out on a channel-forming member having openings of discharge ports. In addition, in order to maintain the state of the surface having openings of discharge ports, ink remaining on the surface having openings of discharge ports is regularly removed by wiping with a rubber blade or the like.

The water-repellent layer is desirably not eroded by liquid such as ink and remains adhered to the channel-forming member, even after being wiped (rubbed) with a blade or the like. Various inks are used for inkjet recording heads and examples thereof include alkaline inks, acidic inks, and inks containing organic solvents. The water-repellent layer desirably has durability against such various inks and is capable of adhering to the channel-forming member. In addition, there has been a demand for simultaneous formation of the channel-forming member and the water-repellent layer from the standpoint of simplification of production processes and reduction in the production cost. In other words, there has been a demand for a channel-forming member that itself has water repellency. However, since fluorine-containing compounds having water repellency generally have a low solubility in other resins, it is difficult to use such compounds as mixtures in combination with photosensitive resins.

The following is a disclosed example of a material that is used for a surface treatment providing a water-repellent and ink-repellent film having durability and can be applied to channel-forming members. Japanese Patent No. 4174124 discloses a water-repellent antifouling coating composition that includes a fluorine-containing epoxy resin having in a single molecule one or more perfluoroalkyl groups having 6 to 12 carbon atoms and two or more alicyclic epoxy groups, and a cationic polymerization catalyst.

Other compounds that have, instead of perfluoroalkyl groups, perfluoro oxy alkylene groups that have a low surface free energy, water repellency, releasability, an antifouling property, and the like, that is, perfluoropolyether groups (hereafter sometimes referred to as PFPE groups) have been attracting attention. Japanese Patent Laid-Open No. 2011-184517 discloses a water-repellent antifouling coating composition that includes a fluorine-containing epoxy resin synthesized by a polymerization reaction between an acrylic monomer having a PFPE group having 4 to 8 carbon atoms and an acrylic monomer having an epoxy group in which the composition proportion of the latter monomer is lower than that of the former monomer.

SUMMARY OF THE INVENTION

A composition according to an embodiment of the present invention includes a fluorine-containing epoxy resin that is a polymer of monomers that include an acrylic monomer (a) having a perfluoropolyether group having 9 or more carbon atoms and an acrylic monomer (b) having an epoxy group in a composition ratio such that a number of acrylic functional groups derived from the acrylic monomer (b) is larger than a number of acrylic functional groups derived from the acrylic monomer (a), and a photoacid generator.

A method for producing a film according to an embodiment of the present invention includes a step of subjecting a composition according to an embodiment of the present invention to cationic polymerization.

A method for producing a film according to an embodiment of the present invention includes a step (1) of forming a photopolymerizable resin layer containing a photopolymerizable resin having an epoxy group and a photoacid generator on a substrate, a step (2) of forming a layer containing a composition according to an embodiment of the present invention on the photopolymerizable resin layer, a step (3) of exposing the photopolymerizable resin layer and the layer containing the composition, and a step (4) of simultaneously curing an exposed portion of the photopolymerizable resin layer and an exposed portion of the layer containing the composition.

A method for producing a film according to an embodiment of the present invention includes a step (1) of forming a photopolymerizable resin layer containing a photopolymerizable resin having an epoxy group and a photoacid generator on a substrate, a step (2) of forming a layer containing a composition according to an embodiment of the present invention on the photopolymerizable resin layer, a step (3) of subjecting the photopolymerizable resin layer and the layer containing the composition to pattern exposure, a step (4) of simultaneously curing an exposed portion of the photopolymerizable resin layer and an exposed portion of the layer containing the composition, and a step (5) of removing an unexposed portion of the photopolymerizable resin layer and an unexposed portion of the layer containing the composition.

A method for producing a liquid discharge head according to an embodiment of the present invention includes forming a film by a method according to an embodiment of the present invention on a surface of a discharge-port-forming member of a liquid discharge head.

Further features of the present invention will become apparent from the following description of exemplary embodiments with reference to the attached drawings.

DESCRIPTION OF THE EMBODIMENTS

Figure 1:
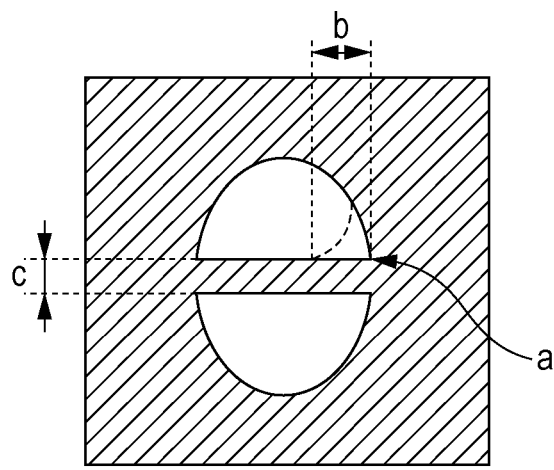
FIG. 1 is a schematic view of a pattern used for evaluating patterning characteristics in Examples.

Various inks have come to be used and smaller ink droplets have come to be discharged. For this reason, in some cases where fluorine-containing epoxy resin compositions having a perfluoroalkyl group are used, the resultant surface of an inkjet recording head does not have sufficiently high water repellency or sufficiently high resolution for forming a fine structure such as discharge ports. Sufficiently high resolution and water repellency are also not achieved in other cases of using a composition including a resin synthesized by polymerizing an acrylic monomer having an epoxy group and an excess amount of an acrylic monomer having a PFPE group having 8 or less carbon atoms.

The present invention provides a composition that provides a film having high water repellency and durability and having high resolution, and a film formed from the composition.

Composition

A composition according to an embodiment of the present invention includes a photoacid generator and a fluorine-containing epoxy resin that is a polymer of monomers that include an acrylic monomer (a) having a perfluoropolyether group having 9 or more carbon atoms and an acrylic monomer (b) having an epoxy group in a composition ratio such that a number of acrylic functional groups derived from the acrylic monomer (b) is larger than a number of acrylic functional groups derived from the acrylic monomer (a).

In the embodiment, the fluorine-containing epoxy resin includes a unit derived from the acrylic monomer (a), which provides higher water repellency. In addition, the fluorine-containing epoxy resin includes a unit derived from the acrylic monomer (b), which provides higher durability. In the embodiment, these acrylic monomers are not used as monomers but are polymerized and used as a polymer. Thus, a composition according to the embodiment that can be patterned with light is applied to a photopolymerizable resin layer; the resultant layer and the photopolymerizable resin layer are together exposed to thereby be simultaneously cured, which can provide higher durability. The monomers are thus polymerized and used as a polymer, which can provide higher compatibility with the photopolymerizable resin layer and provides higher resolution. The number of acrylic functional groups derived from the acrylic monomer (b) is larger than the number of acrylic functional groups derived from the acrylic monomer (a), which can provide higher pattern resolution. Such a composition according to the embodiment can be suitably used as a water-repellent antifouling coating composition.

Acrylic Monomer (a)

The acrylic monomer (a) is not particularly limited as long as it is an acrylic monomer that has a perfluoropolyether group having 9 or more carbon atoms. The acrylic monomer (a) can be at least one of compounds represented by formulae (1), (2), and (3) below from the standpoint of the orientation of the fluorine component in the resultant coating film and the solubility of the acrylic monomer (a) in a reaction solvent.

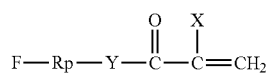

(1)

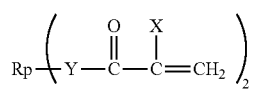

(2)

In the formulae (1) and (2), X represents a hydrogen atom, a fluorine atom, —$CFX^1X^2$ group (where $X^1$ and $X^2$ represent a hydrogen atom or a fluorine atom), a linear or branched fluoroalkyl group having 1 to 21 carbon atoms, a substituted or unsubstituted benzyl group, a substituted or unsubstituted phenyl group, or a linear or branched alkyl group having 1 to 20 carbon atoms; Y represents a single bond, a linear or branched aliphatic group that has 1 to 10 carbon atoms and may have an oxygen atom and be partially fluorinated, an aromatic group that has 6 to 10 carbon atoms and may have an oxygen atom and be partially fluorinated, an alicyclic group, a group having a urethane bond, or a —$CH_2CH(OY^1)CH_2$— group (where $Y^1$ represents a hydrogen atom or an acetyl group); and, in the formula (2), two X's represent the same functional group or different functional groups, and two Y's represent the same functional group or different functional groups.

In the formulae (1) and (2), X can represent a fluoroalkyl group that has 1 or 2 carbon atoms or an alkyl group that has 1 or 2 carbon atoms. In the formulae (1) and (2), Y can represent an aliphatic group that has 2 to 4 carbon atoms. Examples of the aliphatic group include an ethylene group, a propylene group, a butylene group, and an isopropylene group. Y can represent an aromatic group that has 5 or 6 carbon atoms. Examples of the aromatic group include a phenyl group. Examples of the alicyclic group include a cyclohexyl group.

In the formulae (1) and (2), Rp represents a perfluoropolyether group that has 9 or more carbon atoms in which one or more units each constituted by a linear or branched perfluoroalkyl group and an oxygen atom are linked. Rp can represent a perfluoropolyether group that has 12 or more carbon atoms. Specifically, Rp can be a group represented by a formula (6) below. In the formula (6), moieties within the parentheses are each defined as a unit. The values represented by o, p, q, and r each represent the number of the units and are herein referred to as the number of repeating units.

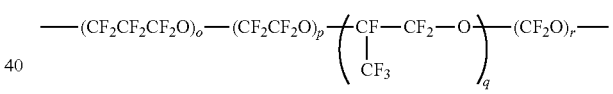

(6)

In the formula (6), o, p, q, and r each represent 0 or an integer of 1 to 30 and satisfy $3 \times o + 2 \times p + 3 \times q + r \geq 9$; and the repeating units may be arranged in random order. Specifically, the arrangement of the repeating units is not limited to that in the formula (6): blocks each including repeating units of a type may be arranged or repeating units of different types may be arranged in random order. In cases where Rp includes a $CF_3$ group, higher water repellency is provided. For this reason, q in the formula (6) preferably satisfies $q \geq 1$, more preferably $q \geq 4$.

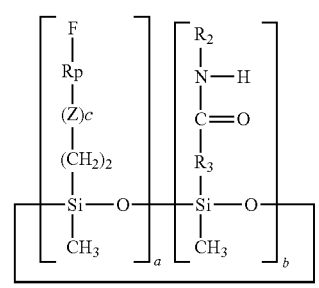

(3)

In the formula (3), a represents an integer of 1 to 4, b represents an integer of 2 to 7, and a+b is 3, 4, or 5; Z represents a divalent organic group; c represents 0 or 1; and Rp has the same definition as in the formulae (1) and (2). In the formula (3), a can represent an integer of 1 or 2; b can represent an integer of 3 or 4; a+b can be 4 or 5; and a and b can satisfy a≥b. Examples of Z include a group that may be partially fluorinated and has 3 to 20 carbon atoms and an ether bond; a group that may be partially fluorinated and has 3 to 20 carbon atoms and an ester bond; a group that includes any one selected from a urethane bond and an amide bond; and a group that is constituted by any one selected from a urethane bond and an amide bond. The group that may be partially fluorinated and has 3 to 20 carbon atoms and an ether bond may be R'—O—R" (where R' and R" each represent an alkyl group that may be partially fluorinated and the total number of carbon atoms of these alkyl groups is selected from the range of 3 to 20). The group that may be partially fluorinated and has 3 to 20 carbon atoms and an ether bond and the group that may be partially fluorinated and has 3 to 20 carbon atoms and an ester bond may each include a cyclic structure or a branch at an intermediate position of the group.

In the formula (3), $R_3$ is a group represented by a formula (4) below; and $R_2$ is a group represented by a formula (5) below.

(4)

In the formula (4), d, e, f, and g each independently represent an integer of 0 to 4 as long as $R_3$ has a molecular weight in a range of 30 to 300. $R_3$ can have a molecular weight in a range of 60 to 150. The repeating units may be arranged in random order. Specifically, the arrangement of the repeating units is not limited to that in the formula (4): blocks each including repeating units of a type may be arranged or repeating units of different types may be arranged in random order.

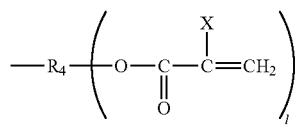

(5)

In the formula (5), $R_4$ represents a divalent or trivalent bonding group that has 1 to 18 carbon atoms and that may have an ether bond and/or an ester bond, an acrylic group moiety, or a methacrylic group moiety; and l represents 1 or 2. $R_4$ can have 2 to 4 carbon atoms. $R_4$ may represent a divalent or trivalent group that is derived from an alkyl group such as an ethyl group, a propyl group, an isopropyl group, or an isobutyl group. $R_4$ represents a divalent group in a case where l represents 1; and $R_4$ represents a trivalent group in a case where l represents 2. X has the same definition as in the formulae (1) and (2). The group represented by the formula (5) can be an acrylic group that has 4 to 20 carbon atoms or a group including an α-substituted acrylic group.

Examples of the compounds represented by the formula (1) include $CF_3(CF_2CF_2O)_5(CF_2)OCOCH=CH_2$, $CF_3(CF_2CF_2O)_5(CF_2)OCOC(CH_3)=CH_2$, $CF_3(CF(CF_3)CF_2O)_5(CF_2)OCOCH=CH_2$, $CF_3(CF(CF_3)CF_2O)_5(CF_2)OCOC(CH_3)=CH_2$, and $F(CF(CF_3)CF_2O)_{10}CF_2CF_2OCOCH=CH_2$.

Examples of the compounds represented by the formula (2) include a commercially available product that is Fluororink MD700 (trade name, manufactured by Solvay Specialty Polymers Japan K. K.). Examples of the compound represented by the formula (3) include a commercially available product that is KY1203 (trade name, manufactured by Shin-Etsu Chemical Co., Ltd.). These compounds may be used alone or in combination of two or more thereof.

Many of the acrylic monomers having an epoxy group that belong to the acrylic monomer (b) described below are insoluble in fluorinated solvents. For this reason, organic solvents are often used in polymerization reactions. In a case where the acrylic monomer (a) is soluble in a non-fluorinated solvent, the polymerization between the acrylic monomers (a) and (b) can be carried out in the same solvent and the polymerization reaction easily proceeds. For this reason, the acrylic monomer (a) can be a monomer soluble in a non-fluorinated solvent.

The mixing ratio of acrylic monomers used in the preparation of a fluorine-containing epoxy resin according to an embodiment of the present invention is appropriately determined in accordance with the form of use of the resin. From the standpoint of providing sufficiently high pattern resolution, the mixing ratio of the acrylic monomer (a) relative to 100 mol % corresponding to the total number of moles of acrylic monomers is preferably 0.5 mol % or more, more preferably 1 mol % or more, and is preferably 50 mol % or less, more preferably 30 mol % or less.

Acrylic Monomer (b)

The acrylic monomer (b) is not particularly limited as long as it is an acrylic monomer that has an epoxy group. The acrylic monomer (b) can be a compound represented by a formula (7) below from the standpoint of providing sufficiently high pattern resolution.

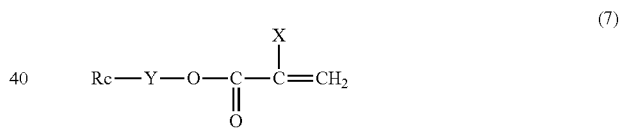

(7)

In the formula (7), Rc represents a substituent having an epoxy group. Examples of Rc include an epoxy group, a glycidoxy group, and a 3,4-epoxycyclohexyl group. Rc can represent a 3,4-epoxycyclohexyl group from the standpoint of polymerization reactivity. X and Y have the same definitions as in the formulae (1) and (2).

Specific examples of acrylic monomers having an epoxy group and represented by the formula (7) include glycidyl methacrylate, 3,4-epoxycyclohexylmethyl methacrylate, and 4-hydroxybutylacrylate glycidyl ether. These acrylic monomers having an epoxy group may be used alone or in combination of two or more thereof.

In the embodiment, the acrylic monomer (a) and the acrylic monomer (b) are mixed in a composition ratio such that the number of acrylic functional groups derived from the acrylic monomer (b) is larger than the number of acrylic functional groups derived from the acrylic monomer (a). The ratio of the number of acrylic functional groups derived from the acrylic monomer (a) to the number of acrylic functional groups derived from the acrylic monomer (b) (hereafter referred to as an acrylic functional group ratio) can satisfy acrylic monomer (a):acrylic monomer (b)=0.1: 9.9 to 4:6, more preferably 0.5:9.5 to 3:7, still more preferably 0.7:9.3 to 2:8.

From the standpoint of providing higher adhesion to the underlying layer and higher durability of the resultant film, the mixing ratio of the acrylic monomer (b) relative to 100 mol % corresponding to the total number of moles of acrylic monomers is preferably 50 to 99.5 mol %, more preferably 70 to 99 mol %. In a case where the mixing ratio is 50 mol % or more, higher resolution is provided and the resultant film has sufficiently high durability. In a case where the mixing ratio is 99.5 mol % or less, the amount of the acrylic monomer (a) is sufficiently large and higher water repellency is provided.

Other Acrylic Monomers

In addition to the acrylic monomer (a) and the acrylic monomer (b), an acrylic monomer having a fluorine-containing group other than perfluoropolyether groups (hereafter referred to as an acrylic monomer (c)) or an acrylic monomer having an alkyl group or an aryl group (hereafter referred to as an acrylic monomer (d)) may be added. Addition of the acrylic monomer (c) suppresses aggregation of the perfluoropolyether group of the acrylic monomer (a) to thereby allow formation of uniform coating films with stability. Addition of the acrylic monomer (d) enhances the degree of freedom of perfluoropolyether groups in the fluorine-containing epoxy resin. This promotes orientation of the unit derived from the acrylic monomer (a) toward the interface between the film and the air, and polymerization of epoxy groups, for example. Note that the acrylic monomer (c) and the acrylic monomer (d) are compounds other than the acrylic monomer (a) and the acrylic monomer (b).

Examples of the fluorine-containing group other than perfluoropolyether groups in the acrylic monomer (c) include alkyl groups having a fluorine atom, aryl groups having a fluorine atom, and phenyl groups having a fluorine atom. The acrylic monomer (c) can be a compound represented by a formula (10) below.

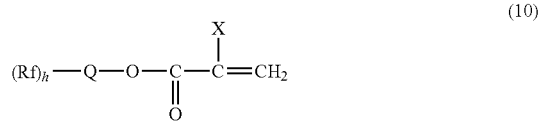
(10)

In the formula (10), Rf represents an alkyl group or aryl group having a fluorine atom; and h represents an integer of 1 or 2. Q represents a divalent or trivalent and linear or branched saturated hydrocarbon group having 1 to 21 carbon atoms, or a cyclic saturated hydrocarbon group having 5 or 6 carbon atoms. In a case where h represents 1, Q represents a divalent group; and, in a case where h represents 2, Q represents a trivalent group. In a case where h represents 2, Rf's may represent the same group or different groups. X has the same definition as in the formulae (1) and (2).

Rf preferably has 1 to 10 fluorine atoms, more preferably 3 to 5 fluorine atoms. The acrylic monomer (c) that has one or more fluorine atoms in Rf can suppress separation between the perfluoropolyether group of the acrylic monomer (a) and the other components, to thereby suppress aggregation of the perfluoropolyether group. The acrylic monomer (c) that has 10 or less fluorine atoms in Rf does not cause aggregation of the Rf moiety and can suppress aggregation of the perfluoropolyether group.

Examples of the alkyl group or aryl group having a fluorine atom include a methyl group, an ethyl group, a n-propyl group, an isopropyl group, a n-butyl group, a sec-butyl group, an isobutyl group, a tert-butyl group, a phenyl group, and a naphthyl group a part of or all the hydrogen atoms of which are substituted with fluorine atoms.

The compounds represented by the formula (10) can be methacrylate compounds having a 2,2,2-trifluoroethyl group or a hexafluoropropyl group from the standpoint of high availability. Examples of the commercially available products of the compounds include "2,2,2-trifluoroethyl methacrylate" manufactured by TOSOH F-TECH, INC; and "M-1210" and "M-1420" manufactured by DAIKIN INDUSTRIES, LTD. The compounds represented by the formula (10) may be used alone or in combination of two or more thereof.

Since the acrylic monomer (c) suppresses aggregation of the perfluoropolyether group of the acrylic monomer (a), the amount of the acrylic monomer (c) added can be adjusted in accordance with the amount of the acrylic monomer (a) added. Although the molar ratio of the amount of the acrylic monomer (c) added to the amount of the acrylic monomer (a) added varies depending on the number of fluorine atoms of the monomers, this ratio is preferably 0.5 to 20, more preferably 1 to 10. In cases where the ratio is 0.5 or more, aggregation of the perfluoropolyether group can be sufficiently suppressed, and generation of irregularities in the surface of the coating film and generation of development residue can be suppressed, for example. In cases where the ratio is 20 or less, degradation of water repellency and antifouling properties can be suppressed because many of the compounds belonging to the acrylic monomer (c) do not themselves exhibit water repellency or antifouling properties.

The acrylic monomer (d) can be a compound represented by a formula (11) below.

(11)

In the formula (11), $R_d$ represents an alkyl group or an aryl group. Examples of $R_d$ include a methyl group, an ethyl group, a propyl group, a butyl group, a hexyl group, and a phenyl group.

Specific examples of the compounds represented by the formula (11) include methyl methacrylate, ethyl methacrylate, and phenyl methacrylate. These compounds represented by the formula (11) may be used alone or in combination of two or more thereof.

Since the acrylic monomer (d) controls the orientation of fluorine atoms of the acrylic monomer (a), the amount of the acrylic monomer (d) added can be adjusted in accordance with the amount of the acrylic monomer (a) added. The molar ratio of the amount of the acrylic monomer (d) added to the amount of the acrylic monomer (a) added varies depending on the length of $R_d$, this ratio is preferably 0.5 to 20, more preferably 1 to 10. In cases where the ratio is 0.5 or more, the unit derived from the acrylic monomer (a) tends to become oriented and high water repellency can be achieved. In cases where the ratio is 20 or less, the resultant film contains a sufficiently large amount of the fluorine component and higher ink resistance is achieved.

Fluorine-Containing Epoxy Resin

The fluorine-containing epoxy resin is a polymer of monomers that are the acrylic monomer (a), the acrylic monomer (b), and optionally other acrylic monomers. Such acrylic monomers can be polymerized in a solvent with an acrylic polymerization initiator, for example. The acrylic polymerization initiator is not particularly limited and examples thereof include 2,2'-azobis(2,4-dimethylvaleronitrile) and azobisisobutyronitrile. Such initiators may be used alone or in combination of two or more thereof. The fluorine-containing epoxy resin preferably has a molecular weight of 500 to 50,000, more preferably 1,000 to 10,000, still more preferably 1,000 to 3,000.

Photoacid Generator

Photoacid generators each include a combination of a cationic moiety and an anionic moiety. Such a photoacid generator upon irradiation with light having a predetermined wavelength undergoes a structural change of the cationic moiety such as decomposition, which results in generation of an acid derived from the anionic moiety. This generated acid causes initiation of the polymerization reaction of the resin and can promote the reaction.

In the embodiment, examples of the photoacid generator include onium salt compounds such as sulfonium salts and iodonium salts, sulfonic acid compounds, and diazomethane compounds. Examples of commercially available products of the photoacid generator include "ADEKA OPTOMER SP-170", "ADEKA OPTOMER SP-172", and "SP-150" (trade names) manufactured by ADEKA CORPORATION; "BBI-103" and "BBI-102" (trade names) manufactured by Midori Kagaku Co., Ltd.; "IBPF", "IBCF", "TS-01", and "TS-91" (trade names) manufactured by SANWA Chemical Co., Ltd.; and "Irgacure290" (trade name) manufactured by BASF Japan Ltd. These photoacid generators may be used alone or in combination of two or more thereof. In addition, in order to improve patterning characteristics, such a photoacid generator may be used in combination with a light absorbent or a sensitizer, for example.

Although the content of the photoacid generator in the composition of the embodiment varies depending on the type of the photoacid generator, the content can be 0.01% or more and 5% or less by mass.

Solvent

The composition of the embodiment may optionally include a solvent from the standpoint of coatability. Examples of the solvent include α-butyrolactone, ethyl lactate, propylene carbonate, propylene glycol monomethyl ether acetate, methyl isobutyl ketone, butyl acetate, methyl amyl ketone, 2-heptanone, ethyl acetate, methyl ethyl ketone, xylene, and alcohols. These solvents may be used alone or in combination of two or more thereof.

Method for Producing Film

A method for producing a film according to an embodiment of the present invention includes a step of subjecting a composition according to an embodiment of the present invention to cationic polymerization.

A method for producing a film according to an embodiment of the present invention can include a step (1) of forming a photopolymerizable resin layer containing a photopolymerizable resin having an epoxy group and a photoacid generator on a substrate;

a step (2) of forming a water-repellent antifouling layer containing a composition according to an embodiment of the present invention on the photopolymerizable resin layer;

a step (3) of exposing the photopolymerizable resin layer and the water-repellent antifouling layer; and a step (4) of simultaneously curing an exposed portion of the photopolymerizable resin layer and an exposed portion of the water-repellent antifouling layer.

The photopolymerizable resin and the polymer in the composition according to the embodiment both have an epoxy group. Accordingly, the epoxy curing step causes the polymerization reaction of epoxy groups even between these different materials. Thus, the photopolymerizable resin layer is chemically bonded to the cured product of the water-repellent antifouling layer and hence these layers are bonded together with high adhesion and separation between the layers caused by liquid such as ink is suppressed. In addition, the above-described method can provide a film having high water repellency and durability.

A method for producing a film according to an embodiment of the present invention can include a step (1) of forming a photopolymerizable resin layer containing a photopolymerizable resin having an epoxy group and a photoacid generator on a substrate;

a step (2) of forming a water-repellent antifouling layer containing a composition according an embodiment of the present invention on the photopolymerizable resin layer;

a step (3) of subjecting the photopolymerizable resin layer and the water-repellent antifouling layer to pattern exposure;

a step (4) of simultaneously curing an exposed portion of the photopolymerizable resin layer and an exposed portion of the water-repellent antifouling layer; and a step (5) of removing an unexposed portion of the photopolymerizable resin layer and an unexposed portion of the water-repellent antifouling layer.

The composition of the embodiment is applied to a photopolymerizable resin layer and subjected to pattern exposure, to simultaneous curing of exposed portions, and then to development. As a result, a film having high resolution can be produced.

A method for producing a film according to an embodiment of the present invention can be suitably used as a method for producing a water-repellent antifouling coating film.

The photopolymerizable resin having an epoxy group is not particularly limited and examples of commercially available products include "CELLOXIDE 2021", "GT-300 series", "GT-400 series", and "EHPE3150" (trade names) manufactured by Daicel Corporation; "157S70" (trade name) manufactured by Japan Epoxy Resin Co., Ltd.; "EPICLON N-865" (trade name) manufactured by Dainippon Ink and Chemicals; and "SU8" (trade name) manufactured by Nippon Kayaku Co., Ltd. These resins may be used alone or in combination of two or more thereof. The photoacid generator may be selected from the above-described photoacid generators.

Examples of the material including a photopolymerizable resin having an epoxy group and a photoacid generator include negative resists. Examples of the negative resists include negative resists that include epoxy resins such as bisphenol A epoxy resins and novolac epoxy resins and the above-described photoacid generators. Examples of commercially available negative resists include "SU-8 series" and "KMPR-1000" (trade names) manufactured by Nippon Kayaku Co., Ltd.; and "TMMR S2000" and "TMMF S2000" (trade names) manufactured by TOKYO OHKA KOGYO CO., LTD. These resists may be used alone or in combination of two or more thereof.

The method for producing the photopolymerizable resin layer is not particularly limited. A composition including a photopolymerizable resin having an epoxy group and a photoacid generator can be applied in the same manner as in application of a composition described below to thereby form the photopolymerizable resin layer.

The photopolymerizable resin layer preferably has a thickness of 1 μm or more, more preferably 3 μm or more, still more preferably 5 μm or more. This thickness is preferably 500 μm or less, more preferably 150 μm or less, still more preferably 100 μm or less.

The film is produced with a composition according to an embodiment of the present invention. The composition can include the above-described solvent from the standpoint of coatability. The composition can be applied with a coating device such as a spin coater, a die coater, a slit coater, or a spray coater. Dip coating can also be employed for the composition that has been adjusted in terms of concentration. In cases where the composition is prepared as a solution and applied, the concentration of the solution is appropriately determined in accordance with the composition of the fluorine-containing epoxy resin, the coating method, and the use of the film. The concentration of the fluorine-containing epoxy resin in the solution is preferably 0.1% to 20% by mass, more preferably 1% to 15% by mass. In a case where the concentration satisfies such a range, the resultant coating film has sufficiently high water repellency and durability and has uniform water repellency over the surface.

The film preferably has a thickness of 50 to 10000 nm, more preferably 80 to 5000 nm. In a case where the thickness is 50 nm or more, the film has uniform water repellency and sufficiently high durability. In a case where the thickness is 10000 nm or less, degradation of patterning characteristics such as pattern deformation or degradation of resolution can be suppressed.

After a coating film of the composition, that is, a water-repellent antifouling layer, is formed by an appropriately selected method, this layer is exposed and the exposed portions are cured by light or heat. This exposure can be carried out by simultaneously exposing the photopolymerizable resin layer and the water-repellent antifouling layer from the standpoint of operability and patterning accuracy. The curing can be carried out by simultaneously curing the exposed portion of the photopolymerizable resin layer and the exposed portion of the water-repellent antifouling layer from the standpoint of operability.

In an embodiment of the present invention, in order to cure epoxy groups in the water-repellent antifouling layer by exposure to light, a photoacid generator is used. During exposure, pattern exposure is carried out to thereby perform a surface treatment of forming fine-structure regions in the water-repellent antifouling coating.

In this case, for the purpose of improving patterning characteristics such as sensitivity and resolution and enhancing durability, an epoxy resin other than the fluorine-containing epoxy resin can be added to the composition. In the composition according to the embodiment, an epoxy polymerization reaction between compounds is caused to achieve high durability; and such addition of an epoxy resin other than the fluorine-containing epoxy resin can further enhance the durability. This addition of an epoxy resin can also increase the viscosity of the composition and increase the thickness of the film.

Examples of the epoxy resin include bisphenol A epoxy resins and novolac epoxy resins. Examples of commercially available products of the epoxy resin include "CELLOXIDE 2021", "GT-300 series", "GT-400 series", and "EHPE3150" (trade names) manufactured by Daicel Corporation; "157S70" (trade name) manufactured by Japan Epoxy Resin Co., Ltd.; "EPICLON N-865" (trade name) manufactured by Dainippon Ink and Chemicals; and "SU8" (trade name) manufactured by Nippon Kayaku Co., Ltd. These epoxy resins may be used alone or in combination of two or more thereof.

The epoxy resin preferably has an epoxy equivalent of 2000 or less, more preferably 1000 or less. In a case where the epoxy equivalent is 2000 or less, a sufficiently high crosslinking density is achieved during the curing reaction, so that a decrease in the glass transition temperature of the cured product does not occur and a high degree of adhesion is achieved. The epoxy resin can have an epoxy equivalent of 50 or more. The epoxy equivalent is measured on the basis of JISK-7236. In formation of a pattern with the composition according to the embodiment, the epoxy resin can be a material that is solid at 35° C. or less because a highly flowable resin may result in degradation of resolution.

The amount of the epoxy resin added relative to 100 parts by mass of the composition is preferably 100 to 500 parts by mass, more preferably 200 to 400 parts by mass.

Method for Producing Liquid Discharge Head

A method for producing a liquid discharge head according to an embodiment of the present invention includes forming a film by a method for producing a film according to an embodiment of the present invention on a surface of a discharge-port-forming member of a liquid discharge head. In the production of a liquid discharge head, a film is formed by the method according to the embodiment, so that the film has high water repellency and durability and has high resolution. The liquid discharge head produced by the method according to the embodiment can be suitably used as an inkjet recording head.

Figure 2:
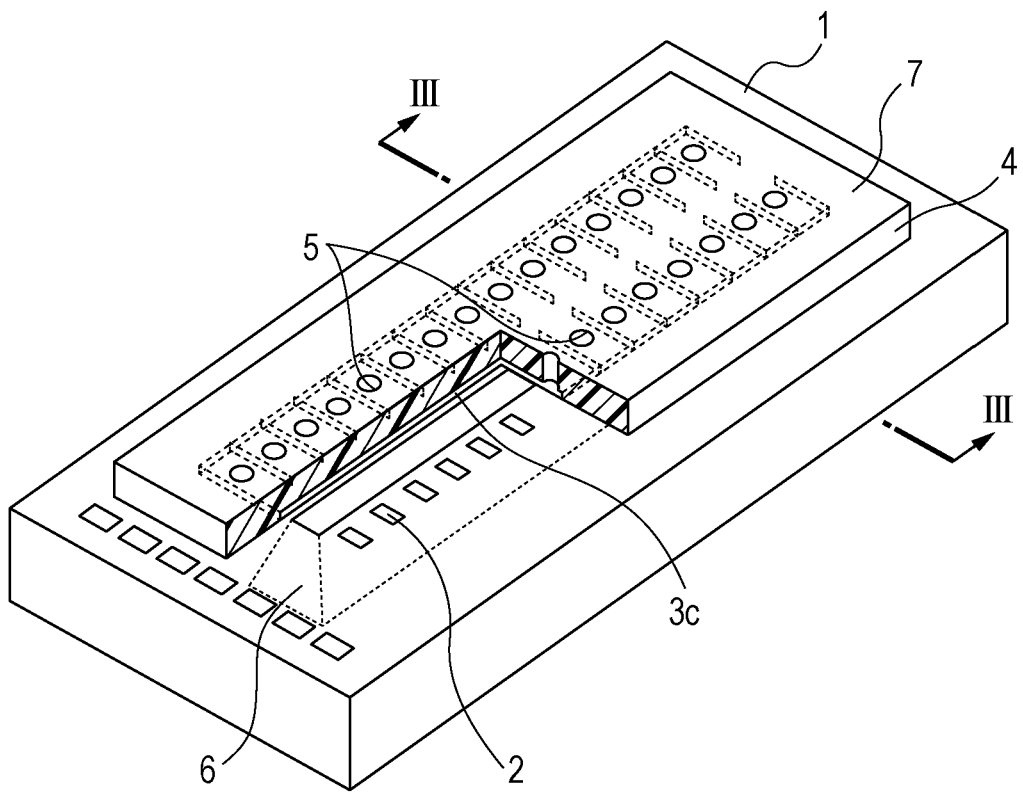
FIG. 2 is a schematic perspective view of a liquid discharge head according to an embodiment of the present invention.

FIG. 2 illustrates an example of a liquid discharge head produced by a method according to an embodiment of the present invention. The liquid discharge head in FIG. 2 includes, on a substrate 1 having a plurality of energy-generating elements 2, a channel-forming member 4 that forms discharge ports 5 for discharging liquid and a channel 3c that is in communication with the discharge ports 5 and holds the liquid therein. A film that serves as a water-repellent antifouling layer 7 is formed on the channel-forming member 4. In the substrate 1, a supply port 6 for supplying the liquid to the channel 3c is formed.

Hereinafter, a method for producing a liquid discharge head according to an embodiment of the present invention will be described with reference to FIGS. 3A to 3F. FIGS. 3A to 3F are explanatory views illustrating production steps in terms of a cross section taken along line III-III in FIG. 2. The energy-generating elements 2 are connected to control signal input electrodes (not shown) for driving the elements.

Figure 3A:
FIGS. 3A to 3F are explanatory views (in terms of a cross section) illustrating steps for producing a liquid discharge head according to an embodiment of the present invention.

Referring to FIG. 3A, the substrate 1 having the energy-generating elements 2 is prepared. The substrate 1 can be a silicon substrate formed of silicon. In particular, the substrate 1 can be formed of a silicon single crystal. In a case where the through-hole is formed in the substrate 1 by anisotropic etching, the substrate 1 can be formed of a silicon single crystal having a crystal orientation (100). In a case where the through-hole is formed in the substrate 1 by dry etching, sand blasting, or use of a laser, the substrate 1 may be formed of a silicon single crystal having a crystal orientation (110), for example.

The energy-generating elements 2 are not particularly limited as long as they apply discharge energy for discharging droplets to liquid so that droplets can be discharged through the discharge ports 5. In a case where the energy-generating elements 2 are, for example, heating resistance elements, these elements heat adjacent liquid to thereby change the state of the liquid, which results in generation of discharge energy.

Figure 3B:
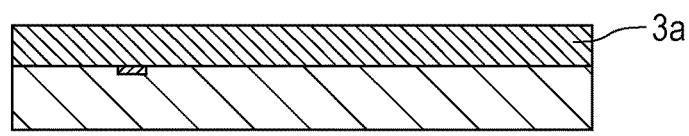

Subsequently, referring to FIG. 3B, a soluble resin composition is applied to the substrate 1 to thereby form a channel pattern layer 3a. The channel pattern layer 3a may be formed in the following manner, for example: a positive photosensitive resin is appropriately dissolved in a solvent, applied to the substrate 1 by spin coating or the like, and then heated. The thickness of the channel pattern layer 3a is the height of the channel 3c to be formed; this thickness is not particularly limited and can be 2 to 50 µm, for example.

Figure 3C:
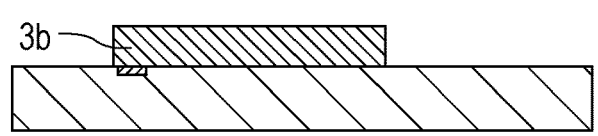

Subsequently, referring to FIG. 3C, the channel pattern layer 3a is irradiated with light and developed to thereby form a template member 3b that serves as a template for the channel 3c.

Subsequently, a channel-forming layer 4 containing the negative resist is formed on the template member 3b and the substrate 1. The thickness of an upper portion of the channel-forming layer 4 on the template member 3b can be 2 µm or more. The thickness of the channel-forming layer 4 is not particularly limited as long as the discharge ports are appropriately formed by development; the thickness of the upper portion of the channel-forming layer 4 on the template member 3b can be 100 µm or less. Furthermore, a composition according to an embodiment of the present invention is applied to the channel-forming layer 4 to thereby form a water-repellent antifouling layer 7. The thickness of the water-repellent antifouling layer 7 is not particularly limited and can be 50 to 5000 nm, for example.

Figure 3D:
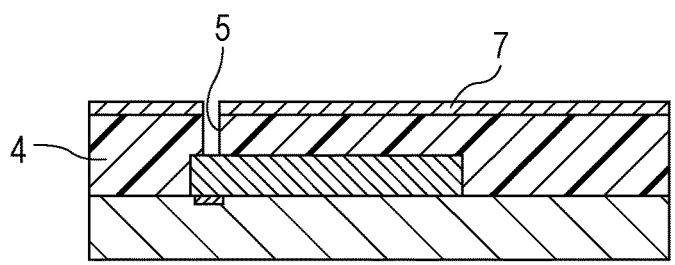

Subsequently, referring to FIG. 3D, the channel-forming layer 4 and the water-repellent antifouling layer 7 are irradiated with light having the i-line wavelength, for example. After that, the channel-forming layer 4 and the water-repellent antifouling layer 7 are heated to be simultaneously cured. Furthermore, these layers are developed with methyl isobutyl ketone (MIBK) or the like such that unexposed portions are turned into the discharge ports 5.

Figure 3E:
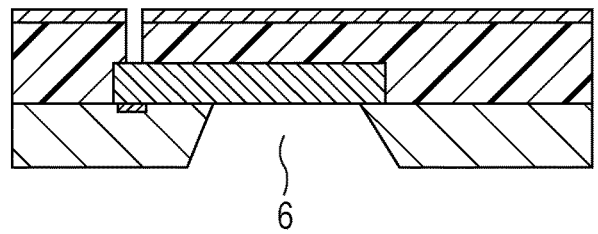

Subsequently, referring to FIG. 3E, the substrate 1 is subjected to an appropriate process such as etching to thereby form a supply port 6.

Figure 3F:
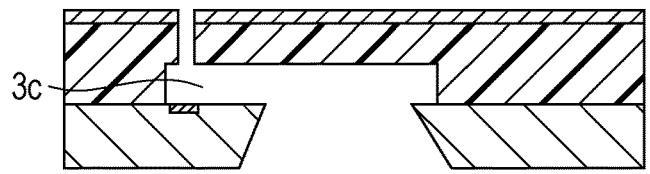

Subsequently, referring to FIG. 3F, the template member 3b is removed by being dissolved in an appropriate solvent. This solvent may be an alkaline aqueous solution or an organic solvent. Furthermore, in order to sufficiently cure the channel-forming member 4, post-baking is carried out with an oven at 200° C. for an hour, for example.

After that, the substrate 1 is cut and divided with a dicing saw or the like to thereby provide chips. In addition, in order to allow each energy-generating element 2 to be driven, an electrical connection is established between an inner lead (not shown) formed in a flexible substrate (not shown) and an electrode pad (not shown) formed in the substrate 1. In addition, chip tank members for supplying liquid are connected to the chips. Thus, liquid discharge heads (not shown) have been completed.

The liquid discharge heads produced by a method according to an embodiment of the present invention can be used as inkjet recording heads, liquid discharge heads for biochip production or electronic circuit printing, or heads for producing color filters, for example.

EXAMPLES

Hereinafter, Examples and Comparative examples will be described; however, the present invention is not limited to these Examples. Measurements and evaluations were carried out in the manner described below.
Preparation of Evaluation Sample An epoxy compound (100 parts by mass, trade name: EHPE3150, manufactured by Daicel Corporation) and 6 parts by mass of a photoacid generator (trade name: SP-172, manufactured by ADEKA CORPORATION) were dissolved in 80 parts by mass of xylene serving as a solvent to provide a photopolymerizable resin composition. This photopolymerizable resin composition was applied to a substrate by spin coating so as to form a film having a thickness of 10 μm, heated at 90° C. for 5 minutes to thereby form a photopolymerizable resin layer. A composition was applied to this layer with a slit coater and heated at 90° C. to thereby form a water-repellent antifouling layer. This composition was applied such that the resultant film having been heated would have a thickness of about 0.5 μm.

Subsequently, the photopolymerizable resin layer and the water-repellent antifouling layer on the substrate were simultaneously irradiated with i-line and then heated at 90° C. for 4 minutes. These layers were developed with a mixed solution of MIBK and xylene and then rinsed with isopropanol to thereby form a desired pattern. Furthermore, the photopolymerizable resin layer and the water-repellent antifouling layer were heated at 200° C. for 1 hour to be cured. Thus, a film was provided.
Pure-Water Contact Angle The formed film was evaluated with regard to initial water repellency: a dynamic receding contact angle θr in terms of pure water was measured with a micro contact angle meter (product name: DropMeasure, manufactured by MICROJET Corporation). The film was also evaluated with regard to durability of the film surface (durability against liquid): the film was immersed in an alkaline aqueous solution having a pH of 10, held at 60° C. for a week, and then rinsed with water; and the dynamic receding contact angle θr of the surface of the film was measured in terms of pure water. In addition, the film was evaluated with regard to durability against rubbing (durability against blade): while being sprayed with an aqueous solution containing carbon black, the film surface was wiped with a blade formed of HNBR (hydrogenated nitrile rubber) 2000 times; and, after that, the dynamic receding contact angle θr of the surface of the film was measured in terms of pure water. Such pure-water contact angles were evaluated on the basis of the following criteria.

Excellent: 90° or more

Good: 80° or more and less than 90°

Fair: 70° or more and less than 80°

Poor: less than 70°

Patterning Characteristics

The evaluation sample was prepared so as to have a model pattern (FIG. 1): a line pattern having a width of 3 μm bridges the opening of an elliptical discharge port so as to extend along the short axis of the discharge port; the discharge port is designed so as to have a long-axis length of 20 μm and a short-axis length of 16 μm. The patterning characteristics were evaluated in the following manner. The portion at which the elliptical opening and the bridging line pattern (c) intersect was observed with a scanning electron microscope (SEM) and the resolution of the portion was measured. Specifically, a patterning evaluation value (unit: μm) was defined as a distance (b) between an end (a) of a half moon shape of a resist pattern supposed to be formed with the mask pattern with high fidelity and the point of intersection of the bridging line pattern (c) and an actually formed pattern. In a case where the half moon shape is accurately formed up to the end (a) in the obtained pattern, the patterning evaluation value is 0 μm. In other words, the dimensions of the obtained pattern in this case are the same as the design dimensions of the mask. In other cases where the patterning evaluation value is more than 0, a negative portion supposed to be removed is left at the end of the half moon shape. On the basis of the size of this negative portion, the patterning evaluation value is determined. The patterning evaluation value was evaluated on the basis of the following criteria.

Excellent: less than 1 μm

Good: 1 μm or more and less than 2 μm

Fair: 2 μm or more and less than 3 μm

Poor: 3 μm or more

Example 1

An acrylic monomer having a PFPE group (17.0 g, trade name: Fluororink MD700, manufactured by Solvay Specialty Polymers Japan K. K.; hereafter sometimes referred to as MD700) serving as the acrylic monomer (a), 8.7 g of glycidyl methacrylate (trade name: GMA, manufactured by KISHIDA CHEMICAL Co., Ltd.) serving as the acrylic monomer (b), and 0.6 g of 2,2'-azobis(2,4-dimethylvaleronitrile) (trade name: V-65, manufactured by Wako Pure Chemical Industries, Ltd.) serving as an acrylic polymerization initiator were dissolved in 10 g of MIBK to provide a monomer solution. Note that MD700 is one of compounds represented by the formula (2) and has a structure represented by a formula (8) below. MD700 is soluble in non-fluorinated solvents.

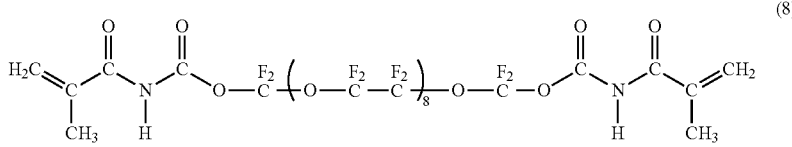

The acrylic functional group ratio was acrylic monomer (a):acrylic monomer (b)=3:7. In a flask having been purged with nitrogen, 50 g of MIBK was placed and heated at 60° C. While this MIBK was subsequently stirred, the above-described monomer solution was dropped into the MIBK. After the entire amount of the monomer solution was dropped, the resultant solution was continuously stirred and heated at 60° C. for 18 hours to thereby provide a fluorine-containing epoxy resin solution. The obtained fluorine-containing epoxy resin solution was subjected to reprecipitation with n-hexane to thereby provide a fluorine-containing epoxy resin as white solid.

The obtained fluorine-containing epoxy resin (4 parts by mass) and 0.2 parts by mass of a photoacid generator (trade name: SP-172, manufactured by ADEKA CORPORATION) were dissolved in 100 parts by mass of PGMEA serving as a solvent to prepare a composition usable for patterning with light. The composition was used to form a film in the manner described in "Preparation of evaluation sample" above and the evaluations were carried out. The results are described in Table 1. The amounts of components in Table 1 are expressed as acrylic functional group ratios except for the right column of Example 8.

Examples 2 and 3

Regarding the acrylic monomer (a), MD700 was replaced by KY1203 (trade name, manufactured by Shin-Etsu Chemical Co., Ltd.). KY1203 is one of compounds represented by the formula (3) and has a structure represented by a formula (9) below.

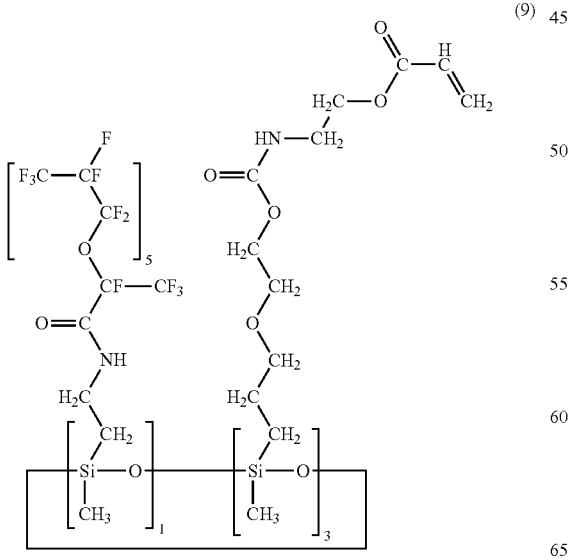

In addition, the acrylic functional group ratios were set to the values described in Table 1. Otherwise, the same conditions as in Example 1 were employed to obtain fluorine-containing epoxy resins. The fluorine-containing epoxy resins were white powders. After that, as in Example 1, compositions were prepared and the compositions were used to form films and the evaluations were carried out. The results are described in Table 1. Since KY1203 includes a large number of $CF_3$ groups in the PFPE groups, the resultant films had higher water repellency.

Examples 4 and 5

Regarding the acrylic monomer (b), GMA was replaced by 3,4-epoxycyclohexylmethyl methacrylate (trade name: CYCLOMER M100, manufactured by Daicel Corporation; hereafter sometimes referred to as M100). The acrylic functional group ratios were set to the values described in Table 1. Otherwise, the same conditions as in Example 3 were employed to obtain fluorine-containing epoxy resins. The fluorine-containing epoxy resins were white powders. After that, as in Example 1, compositions were prepared and the compositions were used to form films and the evaluations were carried out. The results are described in Table 1. The epoxycyclohexyl group included in 3,4-epoxycyclohexylmethyl methacrylate has higher polymerization reactivity than the glycidyl group. For this reason, the compositions of Examples 4 and 5 provided higher resolution so that fine patterns were formed.

Example 6

In addition to the acrylic monomer (a) and the acrylic monomer (b), 2,2,2-trifluoroethyl methacrylate (trade name, manufactured by TOSOH F-TECH, INC.) serving as the acrylic monomer (c) was added so as to satisfy the acrylic functional group ratio described in Table 1. Otherwise, the same conditions as in Example 2 were employed to obtain a fluorine-containing epoxy resin. The fluorine-containing epoxy resin was obtained as white powder. After that, as in Example 1, a composition was prepared and the composition was used to form a film and the evaluations were carried out. The results are described in Table 1.

Example 7

In addition to the acrylic monomer (a) and the acrylic monomer (b), methyl methacrylate serving as the acrylic monomer (d) was added so as to satisfy the acrylic functional group ratio described in Table 1. Otherwise, the same conditions as in Example 2 were employed to obtain a fluorine-containing epoxy resin. The fluorine-containing epoxy resin was obtained as white powder. After that, as in Example 1, a composition was prepared and the composition was used to form a film and the evaluations were carried out. The results are described in Table 1.

Example 8

To 100 parts by mass of the composition prepared in Example 1, 0.8 parts by mass of a photoacid generator (trade name: SP-172, manufactured by ADEKA CORPORATION) and 300 parts by mass of an epoxy resin (trade name: EHPE3150, manufactured by Daicel Corporation) were added. The resultant mixture was diluted with a PGMEA solvent to prepare a composition. The composition was used to form a film and the evaluations were carried out. The results are described in Table 1. In Table 1, the values in the right column of Example 8 are expressed in parts by mass.

Comparative Examples 1 and 2

Fluorine-containing epoxy resins were obtained as in Example 1 except that the acrylic functional group ratios were changed to the values described in Table 1. After that, as in Example 1, compositions were prepared and the compositions were used to form films and the evaluations were carried out. The results are described in Table 1. The patterns for evaluation were observed. As a result, the patterning evaluation values were found to be 3 μm or more and development residue was observed.

Comparative Examples 3 and 4

Fluorine-containing epoxy resins were obtained as in Comparative example 2 except that, regarding the acrylic monomer (a), KY1203 was replaced by PFPE having 7 carbon atoms and the acrylic functional group ratio was changed to the values described in Table 1. After that, as in Example 1, compositions were prepared and the compositions were used to form films and the evaluations were carried out. The results are described in Table 1. The patterns for evaluation were observed. As a result, although the patterning characteristics were not poor, the durability against liquid and the durability against blade were poor.

TABLE 1

| | | | | Examples | | | | | |
|---|---|---|---|---|---|---|---|---|---|
| | | | | 1 | 2 | 3 | 4 | 5 | 6 |
| Water-repellent antifouling coating composition | Fluorine-containing epoxy resin | (a) | MD700 | 3 | | | | | |
| | | | KY1203 | | 3 | 1 | 1 | 0.5 | 2 |
| | | | PFPE having 7 carbon atoms | | | | | | |
| | | (b) | GMA | 7 | 7 | 9 | | | 7 |
| | | | M100 | | | | 9 | 9.5 | |
| | | (c) | trifluoroethyl methacrylate | | | | | | 2 |
| | | (d) | methyl methacrylate | | | | | | |
| | | | SP-172 | | | | | | |
| | | | EHPE-3150 | | | | | | |
| Evaluation | | | Initial water repellency | Excellent | Excellent | Excellent | Excellent | Excellent | Excellent |
| | | | Durability against liquid | Good | Excellent | Excellent | Excellent | Good | Excellent |
| | | | Durability against blade | Good | Good | Excellent | Excellent | Good | Good |
| | | | Patterning characteristics | Good | Good | Good | Excellent | Excellent | Good |

| | | | | Examples | | Comparative examples | | | |
|---|---|---|---|---|---|---|---|---|---|
| | | | | 7 | 8 | 1 | 2 | 3 | 4 |
| Water-repellent antifouling coating composition | Fluorine-containing epoxy resin | (a) | MD700 | | 100 parts by mass | 5 | | | |
| | | | KY1203 | 2 | 2 | | 5 | | |
| | | | PFPE having 7 carbon atoms | | | | | 5 | 3 |
| | | (b) | GMA | 7 | 7 | 5 | 5 | 5 | 7 |
| | | | M100 | | | | | | |
| | | (c) | trifluoroethyl methacrylate | | | | | | |
| | | (d) | methyl methacrylate | | 2 | | | | |
| | | | SP-172 | | 0.8 parts by mass | | | | |
| | | | EHPE-3150 | | 300 parts by mass | | | | |
| Evaluation | | | Initial water repellency | Excellent | Excellent | Good | Good | Fair | Fair |
| | | | Durability against liquid | Excellent | Excellent | Fair | Fair | Poor | Poor |
| | | | Durability against blade | Excellent | Excellent | Poor | Poor | Poor | Fair |
| | | | Patterning characteristics | Good | Excellent | Poor | Poor | Fair | Good |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-088979, filed Apr. 23, 2014, which is hereby incorporated by reference herein in its entirety.

What is claimed is:

1. A composition comprising:
   a fluorine-containing epoxy resin that is a polymer of monomers that includes:
   an acrylic monomer (a) having a perfluoropolyether group having 9 or more carbon atoms;
   an acrylic monomer (b) having an epoxy group; and
   an acrylic monomer (c) having a fluorine-containing group other than perfluoropolyether groups:
   wherein the polymer is obtained by polymerizing a mixture of the monomers and, total number of acrylic groups of the acrylic monomer (b) in the monomer mixture is larger than total number of acrylic groups of the acrylic monomer (a) in the monomer mixture; and
   a photoacid generator.

2. The composition according to claim 1, wherein the acrylic monomer (a) is at least one of compounds represented by formulae (1), (2), and (3) below,

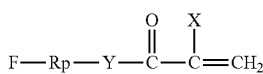

(1)

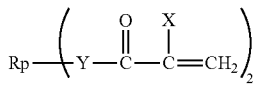

(2)

in the formulae (1) and (2), X represents a hydrogen atom, a fluorine atom, —$CFX^1X^2$ group, a linear or branched fluoroalkyl group having 1 to 21 carbon atoms, a substituted or unsubstituted benzyl group, a substituted or unsubstituted phenyl group, or a linear or branched alkyl group having 1 to 20 carbon atoms, where $X^1$ and $X^2$ of $CFX^1X^2$ represent a hydrogen atom or a fluorine atom; Y represents a single bond, a linear or branched aliphatic group that has 1 to 10 carbon atoms and may have an oxygen atom, an aromatic group that has 6 to 10 carbon atoms and may have an oxygen atom, an alicyclic group, a group having a urethane bond, or a —$CH_2CH(OY^1)CH_2$— group, where $Y^1$ represents a hydrogen atom or an acetyl group, and Rp is a group represented by a formula (6) below,

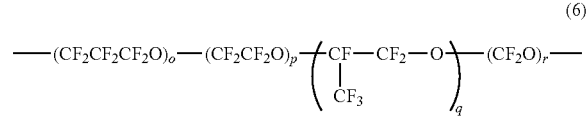

(6)

in the formula (6), o, p, q, and r each represent 0 or an integer of 1 to 30 and satisfy $3 \times o + 2 \times p + 3 \times q + r \geq 9$; and the repeating units may be arranged in random order,

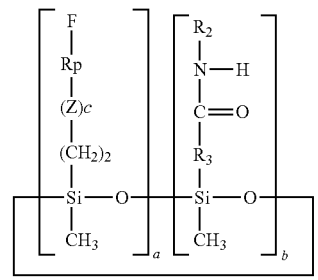

(3)

in the formula (3), a represents an integer of 1 to 4, b represents an integer of 1 to 4, and a+b is 3, 4, or 5; Z represents a divalent organic group; c represents 0 or 1; Rp has the same definition as in the formulae (1) and (2); $R_3$ is a group represented by a formula (4) below; and $R_2$ is a group represented by a formula (5) below,

—$(C_4H_8O)d(C_3H_6O)e(C_2H_4O)f(CH_2O)g$-     (4)

in the formula (4), d, e, f, and g each independently represent an integer of 0 to 4 as long as $R_3$ has a molecular weight in a range of 30 to 300; and the repeating units may be arranged in random order,

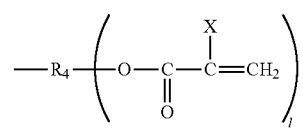

(5)

in the formula (5), $R_4$ represents a divalent or trivalent bonding group that has 1 to 18 carbon atoms and that may have an ether bond and/or an ester bond; l represents 1 or 2; and X has the same definition as in the formulae (1) and (2).

3. The composition according to claim 2, wherein, in the formula (6), $q \geq 1$.

4. The composition according to claim 2, wherein the acrylic monomer (b) is represented by a formula (7) below,

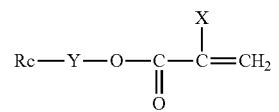

(7)

in the formula (7), Rc represents a substituent having an epoxy group; and X and Y have the same definitions as in the formulae (1) and (2).

5. The composition according to claim 4, wherein, in the formula (7), Rc represents a 3,4-epoxycyclohexyl group.

6. The composition according to claim 1, wherein the monomers include, as another monomer, an acrylic monomer (d) having an alkyl group or an aryl group.

7. The composition according to claim 1, further comprising an epoxy resin other than the fluorine-containing epoxy resin.

8. A method for producing a film, comprising a step of subjecting the composition according to claim 1 to cationic polymerization.

* * * * *